United States Patent
Klatt et al.

(10) Patent No.: US 6,176,724 B1
(45) Date of Patent: Jan. 23, 2001

(54) PC CARD ADAPTER

(75) Inventors: Dieter Klatt, Wülfrath; Heinz Ungermann, Linsengericht; Arnd Bäcker, Hellenthal, all of (DE)

(73) Assignee: Stocko Metallwarenfabriken Henkels und Sohn (DE)

(*) Notice: Under 35 U.S.C. 154(b), the term of this patent shall be extended for 0 days.

(21) Appl. No.: 09/077,643

(22) PCT Filed: Sep. 30, 1997

(86) PCT No.: PCT/EP97/05370

§ 371 Date: May 29, 1998

§ 102(e) Date: May 29, 1998

(87) PCT Pub. No.: WO98/14859

PCT Pub. Date: Apr. 9, 1998

(30) Foreign Application Priority Data

Sep. 30, 1996 (DE) .......................... 296 17 034 U

(51) Int. Cl.[7] .................................................. H01R 13/62
(52) U.S. Cl. ........................... 439/326; 439/630; 439/91
(58) Field of Search .................................. 439/325, 326, 439/327, 341, 69, 71, 91

(56) References Cited

U.S. PATENT DOCUMENTS 5,231,561 * 7/1993 Johnson et al. ..................... 361/424
5,820,391 * 10/1998 Delprete et al. ....................... 439/91

FOREIGN PATENT DOCUMENTS

| 3545527 | 7/1986 | (DE) . |
| 2951870 | 2/1996 | (DE) . |
| 2960725 | 8/1996 | (DE) . |
| 1952379 | 1/1997 | (DE) . |
| 5721845 | 12/1982 | (EP) . |
| 0434192 | 6/1991 | (EP) . |
| 0490530 | 6/1992 | (EP) . |
| 2693019 | 12/1993 | (FR) . |

OTHER PUBLICATIONS

"IBM Technical Disclosure Bulleting: 3–Degree of Freedom . . . ", Dec. 12, 1993, p. 595.

* cited by examiner

Primary Examiner—Lincoln Donovan
(74) Attorney, Agent, or Firm—Robert W. Becker & Associates

(57) ABSTRACT

An adaptor for connecting a miniaturized electronic storage module, especially a miniature card (2) with 60 surface contacts, to a personal computer (PC) a notebook, or a similar data processing system with PCMCIA port whereby at a plug-in card-shaped outer housing (3) a PCMCIA plug (4) is provided at one end face which is connected especially by soldering connections (5) with electronic components supported on the circuit board (7), whereby at the oppositely arranged side a contact field (8) with a conductive rubber strips (10) or contact springs for electrically contacting the miniature card (2) is arranged below a housing window (11) with a frame (12) for insertion and removal of the miniature card (2). In order to increase the functional reliability, especially in the contacting area of the miniature card (2) such that the high contact forces can be compensated over the life expectancy of the adaptor with minimal constructive expenditure without causing damage, it is suggested that the transition area (14) from the printed circuit board (7) to the contact field (8) is provided with a reinforcement means below the contact field (8) in order to counteract counter forces resulting from insertion of the miniature card (2).

12 Claims, 6 Drawing Sheets

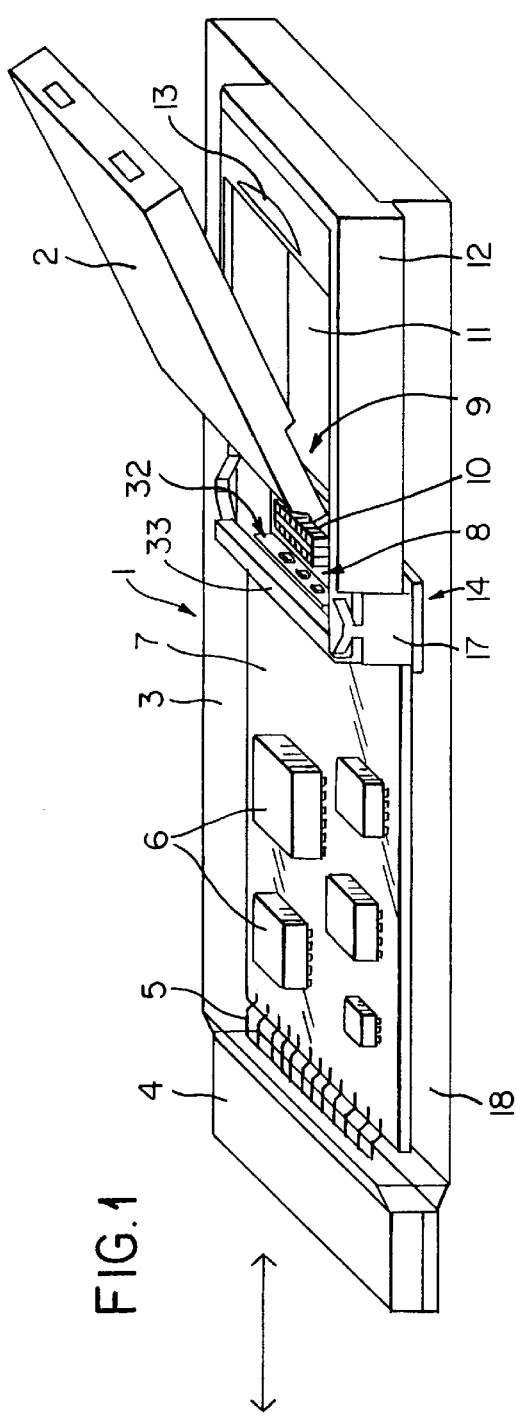
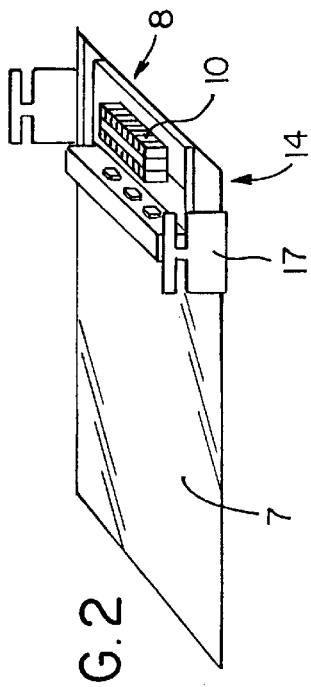
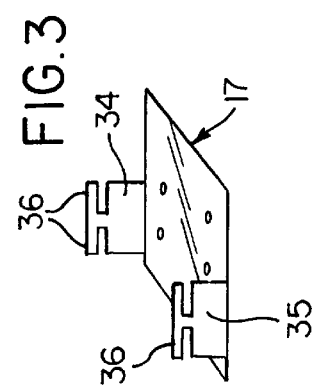

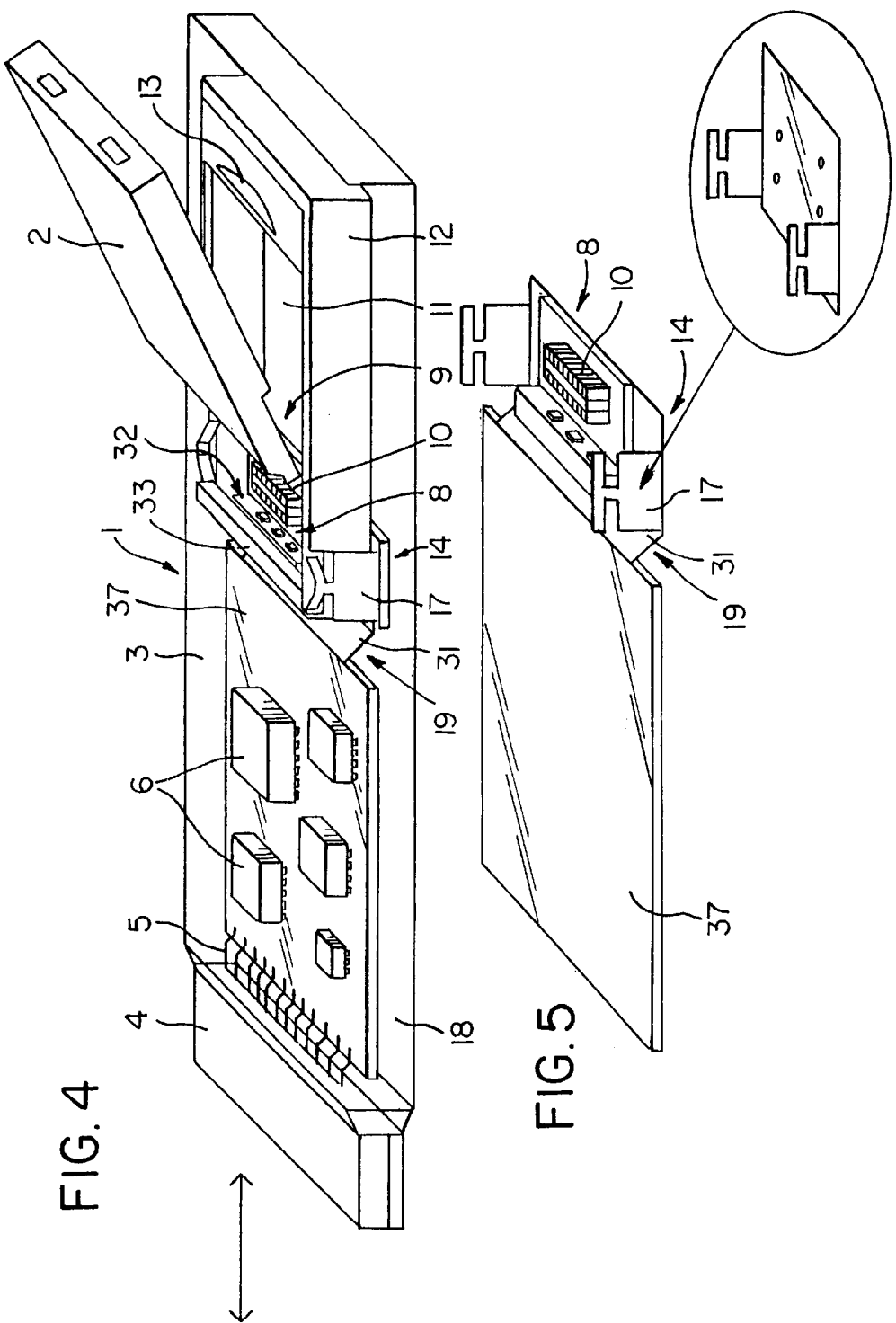

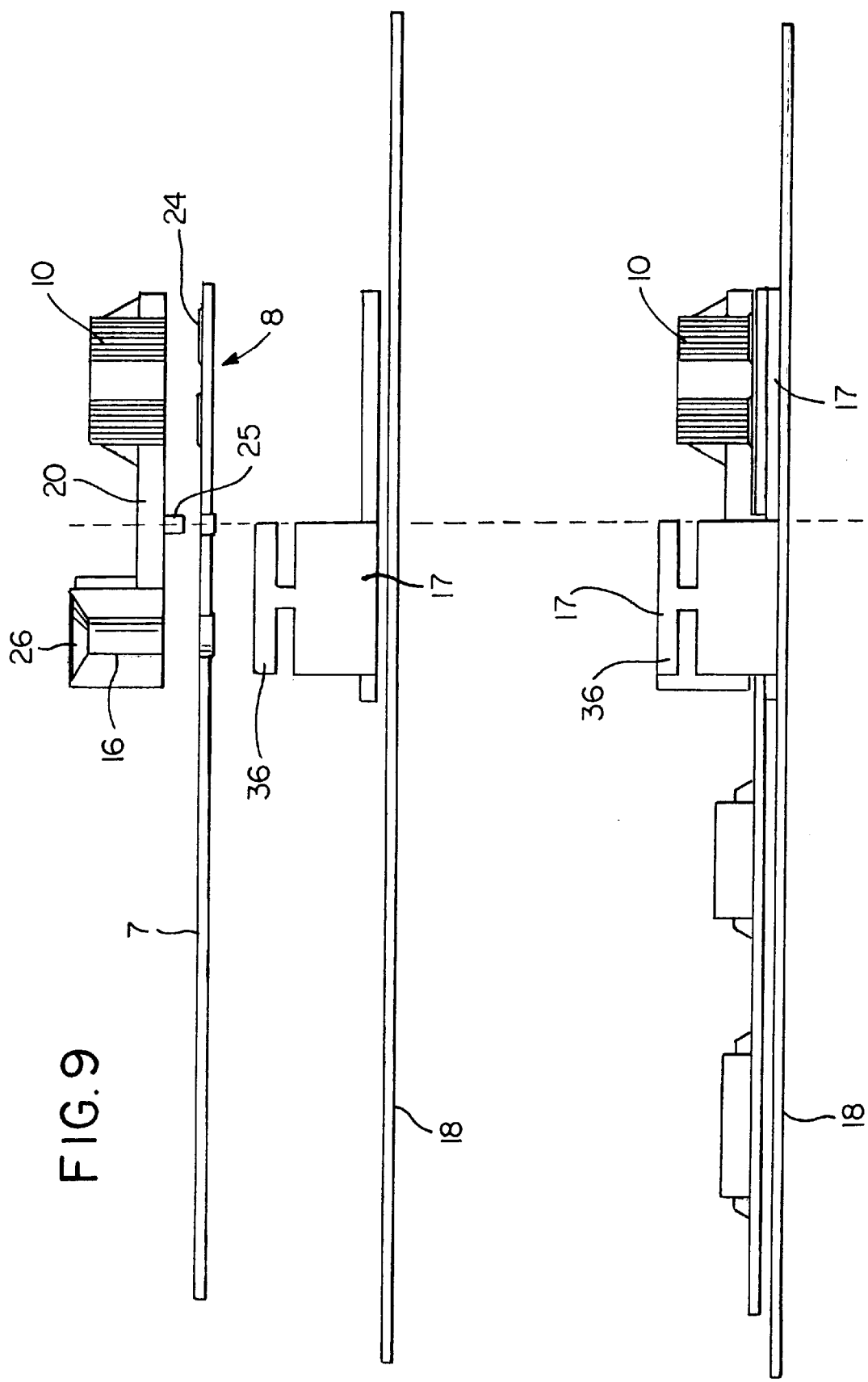

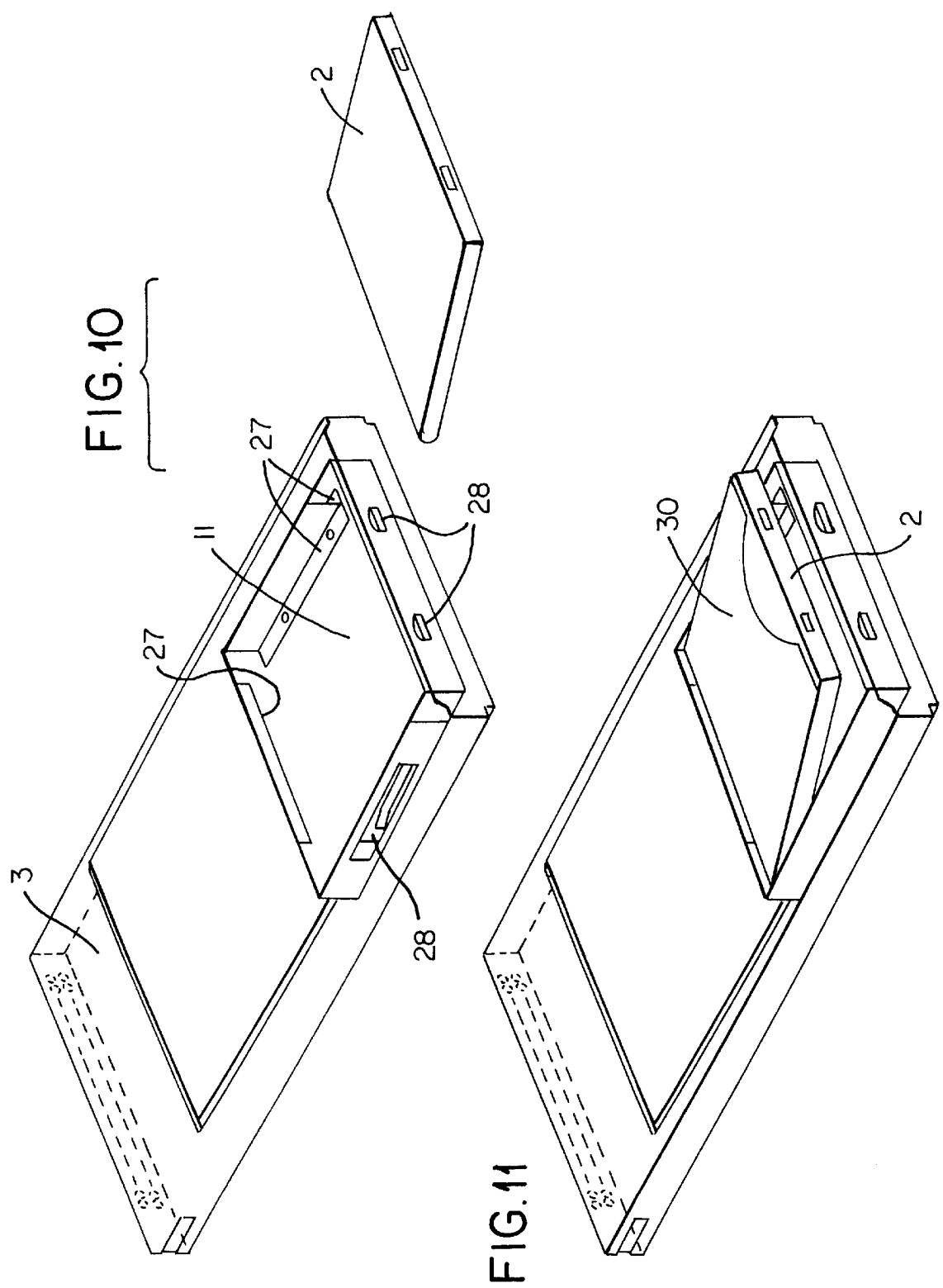

PC CARD ADAPTER

BACKGROUND OF THE INVENTION

The invention relates to an adaptor for connecting a miniaturized electronic storage module, especially a miniature card with 60 surface contacts, to a personal computer (PC), a notebook, or similar data processing system with PCMCIA port, whereby a PCMCIA socket is provided at an end face of a card-shaped outer housing which is connected especially by soldering connections to electronic components of a circuit board, whereby at the opposite side contact fields, corresponding to the surface contacts of the miniature card and provided with conductive rubber strips or contact springs for electrical contacting of the miniature card, are arranged below a housing window with a frame for insertion and removal of the miniature card.

So-called miniature cards are miniaturized electronic storage modules for different applications. At present, especially the use for digital cameras as so-called flash cards is of interest where directly digital data of the camera are written onto the miniature card and stored therein. Other known applications are voice recording and voice reproduction systems. For further processing of the thus used miniature cards, adaptors are provided which are connectable to a data processing system and thus connect the miniature card mechanically and electrically to the data processing system. For this purpose, the adaptor has at its end face a PCMCIA socket. The data processing system must therefore be provided with a corresponding PCMCIA slot in order to provide for mechanical and electrical and electric contacting of the miniature cards via the adaptor. The adaptor comprises among other things a PCB, controller components, driver components, and storage components as well as contacting elements. It is then possible to transmit via the adaptor data, for example, from the notebook onto the miniature card or vice versa data written onto the miniature card in other applications data onto the PC platform.

The miniature card is inserted into a housing window provided in the plug-in card-shaped outer housing, below which a receiving frame is connected which allows insertion and removal of the miniature card. The miniature card is provided with 60 surface contacts which are positioned in an elongate depression at the underside of the miniature card in the form of a contact field. A corresponding contact field with a conductive rubber strip or contact springs for electrically contacting is positioned in the frame below the housing window and is connected with the printed circuit board of the adaptor so that via the surface contact connection the miniature card, when inserted, is connected to the printed circuit board of the adaptors and via the adaptor is thus connected to the PCMCIA socket at the end face which is inserted into a respective slot of a PC, notebook, or other data processing system with PCMCIA port for data exchange.

It is a disadvantage of such an adaptor that the high contact forces of greater than 60N which are applied upon insertion of a miniature card via that conductive rubber strip onto the outer housing, may result in deformation which, in turn, prevents the secure contacting of the conductive rubber strip at the contact pad of the contact field positioned therebelow. Compensation of the occurring forces by the thin bottom sheet metal of the outer housing is not ensured. In cases in which between the contact field of the adaptor and the outer housing a printed circuit board is arranged, the mechanical stability and stiffness in the contact area is not sufficient. Especially the operational safety of the adaptor is additionally impacted by manipulation because especially its use as an exchangeable medium results in stress from transport such as bending, torsional, and thermal loading. A simple mechanical reinforcement of the adaptor with increased wall thickness in the housing area is not possible because the dimensions with minimal tolerances as a standard, especially for the PCMCIA type II, are set so that only minimal constructive variations are possible.

The invention has the object to increase functional reliability while avoiding the aforementioned disadvantages, especially in the contacting area of the miniature card, so that the high occurring contact forces can be received without causing damage over the lifetime of the adaptor with minimal constructive expenditure.

SUMMARY OF THE INVENTION

The object is inventively solved in that in the transition area from the printed circuit board to the contact field a reinforcement means is provided below the contact field in order to counter act the forces resulting from insertion of the miniature card. The reinforcement means constructively provides the possibility for predetermined dimensions to maintain the contact area, which for each insertion of a miniature card is subjected to great deforming forces, reliably functional whereby the reinforcement preferably is in the form of an additional reinforcement plate of metal or plastic or metal/plastic laminate which is accommodated between the outer housing and the printed circuit board within the adaptor in the transition area. The stability of the contact area as well as of the adaptor in its entirety is thus considerably improved.

In a preferred embodiment of the invention the frame, positioned below the housing window for the miniature card, is connected under fixation of the printed circuit board in the transition area to the reinforcement plate in the form of a reinforcement sheet metal so as to provide a separate module comprised of the printed circuit board with PCMCIA socket, connecting field, frame, and reinforcement sheet metal. By providing such a module, a pre-manufacturing and optimal storage without housing is possible whereby the modules are already functional and thus can be tested. The testing of their functionality can be performed in an intermediate mounting step so that losses are cut when a faulty module is detected.

In order to provide such a module, it is advantageous to provide the outer sides of the reinforcement sheet metal with upwardly extending clamping tabs which engage respective cutouts in the frame by a clamping or snapping action. This provides for a simple fastening of the reinforcement sheet metal, which may be a single-piece stamped part, to the frame for the miniature card with exact positioning at the location where the contacting forces are received. The reinforcement sheet metal can advantageously by concavely curved and thus provide an abutment below the contacting field. The concave embodiment thus causes the reinforcement sheet metal to act as a spring under pretension that is thus optimally suitable to receive the contacting forces which are transmitted upon insertion of the miniature card via the conductive rubber strip and the contact pads onto the circuit board, respectively, the contacting field.

For a safe electrical contacting a sufficient contacting force is required. It may be advantageous in this context to embody the frame comprised of plastic in the transition area such that it has an undercut so that the miniature card when inserted can be secured by its leading edge being engaged. The leading edge of the miniature card is thus pushed upon insertion practically under the projecting transverse strip of the frame which thus provides an upper abutment. The conductive rubber strip is deformed by the pressing forces whereby the contacting forces transmitted onto the contact field are received by the lower abutment in the form of a reinforcement sheet metal. An optimal contacting with regard to positioning, securing, as well as transmitted contact forces is thus ensured.

Often, instead of simple printed circuit boards, so-called multi-layer printed circuit boards are used in which one layer supports the leads. For such an embodiment of the circuit board, in an expedient further development of the invention it is suggested to have the layer supporting the leads project in one direction past the actual base member of the multi-layer circuit board to the contact field and to embody it as a thin lead foil transition which, when needed, can be bent in the manner of a foil joint into a desired position. The bending can be performed according to a Z-shape or also as a multiple meander-shape when a certain length adjustment must be provided. It is especially advantageous to employ the flexibility of the lead foil transition in order to arrange the circuit board itself in a lifted position with a spacing to the outer housing in order to allow furnishing of the circuit board with electronic components on both sides. This is especially advantageous in that with the same outer dimensions of the adaptor an optimal electronic adaptation to the respective application is possible.

The reinforcing means can advantageously project past the transition area on one or both sides in order to provide increased stability to the entire outer housing. According to a specially embodiment of the invention, the receiving frame for the miniature card can be embodied from folded portions of the outer housing whereby, when a double folding of the outer housing is provided, the lower folded portion can be connected to the reinforcement means. In this context it is advantageous to stamp or cut the optionally required pressure spring, guide spring, and return spring from the folded housing portions.

The receiving frame for the miniature card can also be provided with an additional cassette chamber that has the function to return the miniature card, after release, always into the same removal position.

BRIEF DESCRIPTION OF THE DRAWINGS

Further details, features, and advantages of the invention will result from the following description and the accompanying drawings, showing different embodiments of the inventive adaptor in a schematic manner. It is shown in:

FIG. 1 a PC card adaptor for mini cards in a perspective view;

FIG. 2 a schematic, perspective view of the circuit board of the adaptor according to FIG. 1 of the drawing with contact field and reinforcement sheet metal whereby components of the printed circuit board are not shown;

FIG. 3 a reinforcement plate of the adaptor of FIG. 1 in a perspective view;

FIG. 4 a second embodiment of a PC card adaptor with multi-layer circuit board in a perspective view;

FIG. 5 the multi-layer printed circuit board of the adaptor of FIG. 4 with contact field as well as reinforcement sheet metal, shown in a perspective exploded view;

FIG. 9 an exploded view of the parts of the adaptor in a schematic representation;

FIG. 10 a changed embodiment of the housing of adaptor in a perspective view;

FIG. 11 a housing for the adaptor with additional cassette chamber in a perspective representation.

DESCRIPTION OF PREFERRED EMBODIMENTS

Figure 6:
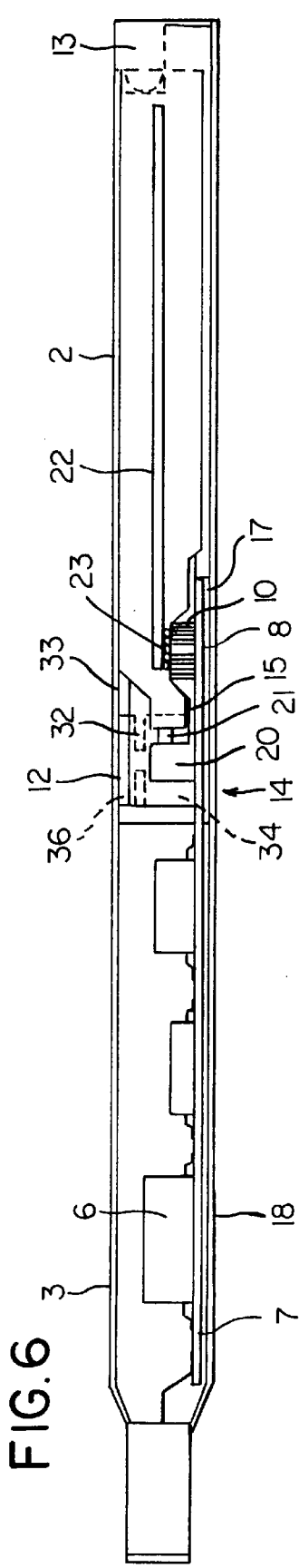
FIG. 6 a schematic side view of the interior of the adaptor of FIG. 1 with parts not shown.

The adaptor 1 represented in perspective view in FIG. 1 serves as connector of a miniaturized electronic storage module, conventionally called a miniature card or mini card 2, to a personal computer, notebook etc., i.e., a non-represented data processing system, with PCMCIA port. In the drawing, housing parts are not shown in order to allow a view into the interior of the adaptor for illustrating the schematic design. It can be seen that within the outer housing 3 that is in the form of a plug-in card, and as well be seen in more detail in other representations of FIGS. 10 and 11, provided at its end face with a PCMCIA socket 4 of a known design with 68 standardized connectors. They are connected by soldering connections 5 to the electronic components 6 of the printed circuit board 7 with non-represented integrated circuit. At the opposite side of the circuit board 7, approximately centrally with regard to the housing 3, a contact field 8 for the mini card 2 is provided which in position and design corresponds to the non-represented surface contacts at the underside of the mini card 2. The direct contact between these surface contacts 9 of the mini card and the contact field 8 is achieved by a known conductive rubber strip 10 which presses onto the surface contacts 9 after the mini card 2 has been inserted into the adaptor 1.

For introducing, securing, and removing the mini card 2, the outer housing 3 is provided at its upper side with a window in the form of a rectangular cutout 11 into which a receiving frame 12 as a unitary plastic part is inserted. It is provided with non-illustrated securing elements for the mini card and a locking/release device 13. Above the window 11 the mini card 2 is shown which is at a slant for insertion and which, after engagement of a corresponding forward securing cutout 32, is forced into a flat position within the receiving frame 12 and is secured with the locking device 13. Its surface contacts 9, under deformation of the conductive rubber strip 10, are electrically contacted to the circuit board 7 and thus to the PCMCIA socket. The upper strip-shaped roof-shaped projection 33 of the securing element 32 of the frame 12 thus provides an upper abutment for positioning and fixation of the leading edge of the mini card 2 when inserted.

The area of the adaptor in which the circuit board 7 is connected to the contact field 8, is defined as a transition area 14 in which the leads 31 (FIGS. 4 and 5) of the circuit board 7 are connected with contact springs or contact pads above which the conductive rubber strip is arranged with which, in turn, the contact springs or contact pads of the mini card 2 are brought into contact. In the transition area 14 a contact field 8 is formed which supports a receiving and connecting housing 15 (FIGS. 6 and 7) for the conductive rubber strip 10. For this purpose, an AUGAT (trademark) plug of a known design is used. The attachment in the shown embodiment is achieved by a centrally arranged bore 16 with the aid of a rivet connection which will be explained in the following in more detail.

In the transition area 14 from the circuit board 7 to the contact field 8 a reinforcement means is arranged below the contact field 8 in order to counteract the contact forces resulting from insertion of the mini card 2. In the embodiment represented in the drawings, the reinforcement means is a reinforcement sheet metal 17 which is shown in a perspective view in detail in FIG. 3. This element is a stamped part of steel sheet with upwardly extending clamping tabs 34, 35 at which inwardly deformable clamping legs 36 are provided by lateral cutouts which engage respective cutouts in the frame 12 in a clamping or snap-in action. The reinforcement sheet metal 17 is arranged in the transition area 14 below the circuit board 7 which is provided with the plug-in and the conductive rubber strip 10. Subsequently, the frame 12 placed on top provides a clamping connection or catch connection by interlocking or snapping in of the free legs 36 in the corresponding cutouts of the frame 12. In this manner, a module that can be separately handled is provided as an intermediate product which is comprised of the printed circuit board 7 with PCMCIA socket 4, contact field 8, frame 12, and reinforcement sheet metal 17 and which is fully functioning. The module can then be inserted simply into the outer housing 3.

It should be noted that instead of the reinforcement sheet metal 17 it is also possible to use a reinforcement plate which is inserted into the intermediate space between the bottom 18 of the outer housing and the circuit board 7 at least in the area of the transition area 14. The reinforcement sheet metal according to FIG. 3 as well as the reinforcement plate can be made of steel or plastic or steel/plastic laminate which then receives the considerable forces exerted in the transition area 14 upon insertion of the mini card 2 into the adaptor 1 to the fullest extent without any deformation and thus with highest possible contacting safety.

FIGS. 4 and 5 of the drawings show a different embodiment of an adaptor 1 in which the circuit board is a multi-layer circuit board 37 wherein the layer supporting the leads 31 projects in the longitudinal direction past the actual circuit board 7 to the contact field 8 and is embodied as a thin lead foil transition in the transition area 14 which when needed can be brought into the desired position in the manner of a foil joint. It can be seen in the perspective representation of FIG. 5 that the circuit board 7 is positioned at a level above the bottom 18 of the outer housing 3 and that the contact field 8 is thus positioned lower within the housing. The connection is electrically and mechanically provided by the flexible lead foil transition according to the slantedly shown portion 19 in the drawing between the circuit board 7 and the contact field, whereby the flexible lead foil transition in comparison to the thickness of the circuit board is substantially thinner. This is so because the multi-layer circuit board 7 has its integrated lead foil extend therefrom in the form of an extension, and in this area it supports the AUGAT plug-in part. The slanted area 19 is illustrated such that the transition, due to the flexibility of the foil, can have a roof-shaped or Z-shaped or meander-shaped design. In this embodiment the U-shaped sheet metal member 17 is also used as an abutment within the transition area 14.

Figure 7:
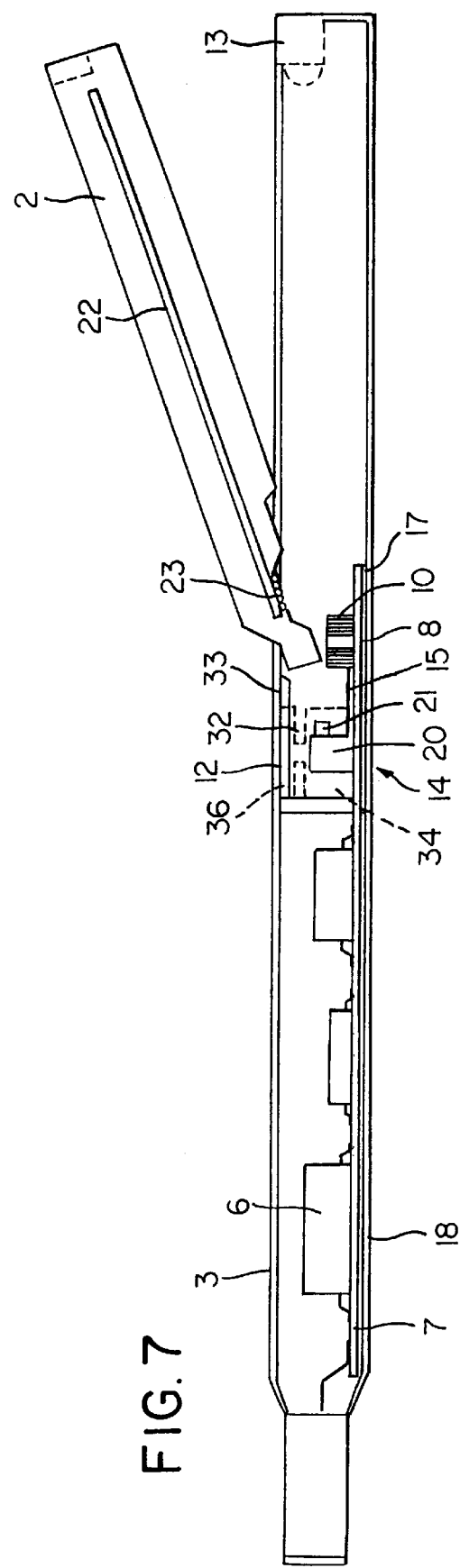
FIG. 7 a schematic side view of the interior of the adaptor with parts not shown and a mini card in a position illustrating the insertion step.

The side views of FIGS. 6 and 7 illustrate the design of the adaptor 1 in even more detail. It can be seen that the outer housing 3 is a thin sheet metal part having a bottom 18 on which the reinforcement sheet metal 17 is directly arranged whereby the reinforcement fills the entire space between the side walls. Directly above the reinforcement sheet metal 17 the circuit board 7 with electronic components 6 is provided having also the contact field 8 directly above the reinforcement sheet metal 17. In the area of the contact field the receiving and connecting housing 15 for the conductive rubber strip 10 in the form of the AUGAT plug-in is connected to the circuit board 7. This attachment is realized by a central bore 16 in the form of a rivet connection (compare FIG. 9). On the receiving and connecting housing 15 the receiving chamber 12 for the mini card 2 is provided which is tightly engaged on both sides by the clamping tabs 34 and 35 and is secured in the respective cutout of the receiving frame 12 by interlocking the clamping legs 36. This provides an individual module that is already functioning and can be subjected to testing.

Figure 8:
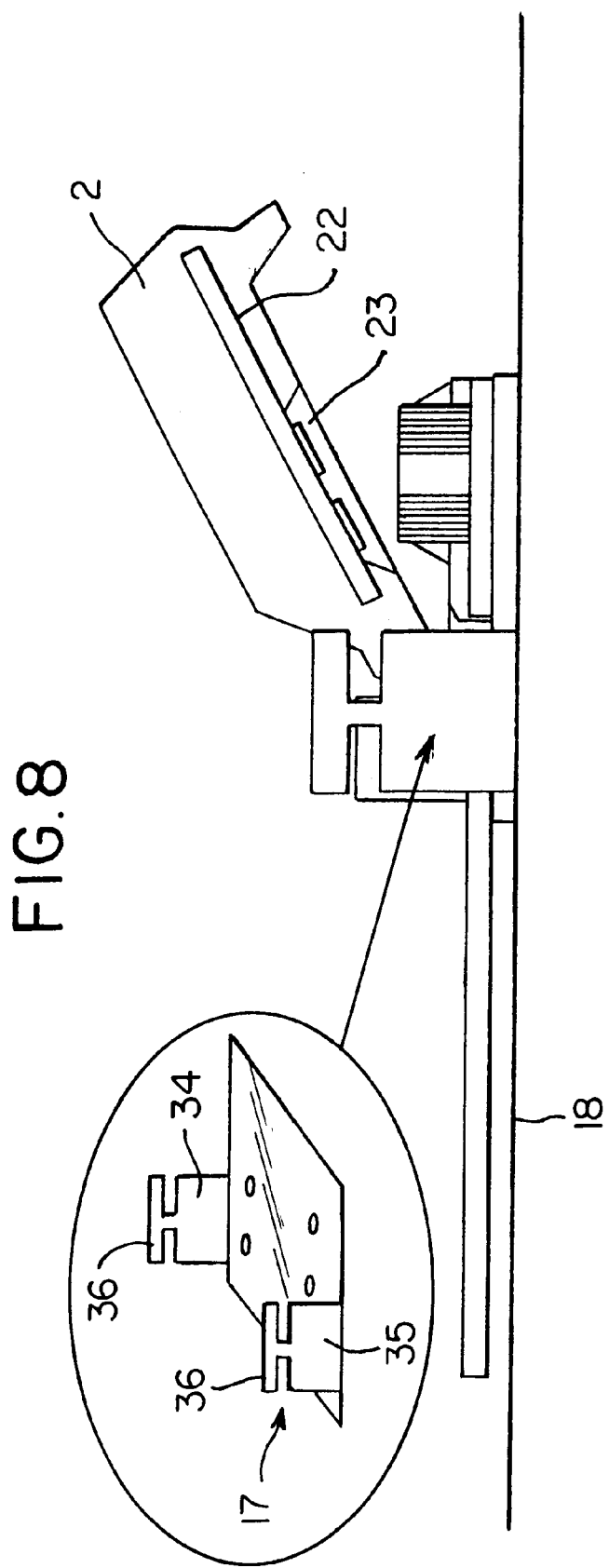
FIG. 8 a detail of the central area of the adaptor with parts no shown and the reinforcement sheet metal, printed circuit board, and contact fields shown in exploded perspective view.

The receiving frame 12 is provided at its front end into which the mini card 2 is inserted with forward securing cutouts 32 which form the schematically shown projection 33 of FIG. 7 for engaging the leading edge of the mini card 2. It is possible to provide in addition a pressure spring 21 which serves to secure the mini card 2 in its position within the adaptor, respectively, to provide for release and removal from the snap-in locking mechanism 13. The contacting position is shown in FIG. 6 whereby it is schematically indicated how the integrated circuit in the form of a printed circuit board 22 of the mini card rests with its surface contacts 23 in the forward area on the rubber strip 10 so that the electrical connection to the circuit board 7 is realized. In FIG. 7 of the drawing the slanted insertion position of the mini card is shown in which the surface contacts 23 do not contact the conductive rubber strip 10. This can be seen in more detail in FIG. 8 of the drawing.

FIG. 9 of the drawing shows the design of the contacting unit for mounting the adaptor, comprised of the circuit board 7 with integrated circuit and contact field 8 which shows the contact surfaces 24 in the form of pads for the conductive rubber strip 10. Furthermore, the AUGAT plug 20 is arranged above while below the reinforcement sheet metal 17 is positioned above the bottom 18 of the outer housing 3. The described parts with the exception of the bottom 18 are positioned atop one another and are secured and aligned by positioning pins 25 in their correct geometric alignment. Subsequently, the receiving frame 12, not represented in FIG. 9, is placed thereon and is fixedly connected by the free legs 36 of the clamping tabs 34, 35 by interlocking in corresponding cutouts. In this manner, an easily handled unit is provided which can be simply inserted into the outer housing.

In the outer housing 3 represented in FIG. 10 of the drawing, the adaptor no longer has a separate receiving frame 12 but instead a frame that is produced by folding the outer housing. For this purpose, when producing the window 11, the outer housing is provided with lateral folds 27 (twice folded edges) in order to provide in a simple manner a receiving frame for the mini card 2 by bending operations without requiring additional material. By providing a twice folded portion of the outer housing, the lower folded surface can be fixedly connected to the reinforcement sheet metal 17 or to the bottom 18 of the outer housing, as can be seen in the drawing by the two illustrated bores. Furthermore, required pressure springs, guide springs, and return springs 28 can be stamped or cut out of the folded housing portions 27.

FIG. 11 of the drawing shows an additional separate cassette chamber 30 for receiving a mini card 2.

The present invention is, of course, in no way restricted to the specific disclosure of the specification and drawings, but also encompasses any modifications within the scope of the appended claims.

What is claimed is:

1. An adapter for connecting a miniature electronic storage medium to a data processing unit having a PCMCIA port, said adapter comprising:

a housing having an end face;

a printed circuit board, having electronic components connected thereto, positioned in said housing;

a PCMCIA socket connected to said end face;

solder connections connecting said PCMCIA socket to said printed circuit board;

a frame positioned on a first face of said printed circuit board at an end of said printed circuit board remote from said PCMCIA socket;

said frame having a cutout for receiving a mini electronic storage medium;

a contact field, comprising a conductive rubber strip or contact springs for electrically contacting the mini electronic storage medium, connected to said first face of said printed circuit board and positioned within said frame;

a reinforcement member mounted on a second face of said printed circuit board opposite said contact field and having a base plate and lateral tabs projecting from said base plate in a direction in which said first face faces, wherein said reinforcement member counteracts contacting forces resulting from insertion of the mini electronic storage medium;

said tabs of said reinforcement member laterally secured at said frame and clamping said printed circuit board between said frame and said base plate.

2. An adapter according to claim 1, wherein said reinforcement member is a plate consisting of metal or plastic or a metal/plastic laminate and is inserted between a bottom of said housing and said printed circuit board in said transition area.

3. An adapter according to claim 1, wherein said frame, said reinforcement member, and said printed circuit board are fixedly connected to one another so that a separate module comprised of said frame, said printed circuit board, said PCMCIA socket, said contact field, and said reinforcement member is formed.

4. An adapter according to claim 3, wherein said frame has cutouts for receiving said tabs and securing said tabs by a clamping action or a snapping action.

5. An adapter according to claim 3, wherein said reinforcement member is concave and provides a spring action below said contact field.

6. An adapter according to claim 1, wherein said frame is comprised of plastic and has an undercut at said transition area, wherein a leading edge of the mini electronic storage medium is secured by said undercut when inserted into said frame.

7. An adapter according to claim 1, wherein said printed circuit board is a multi-layer circuit board having a base member and a lead-carrying layer, wherein said lead-carrying layer extends past said base member to said contact field and is embodied as a thin lead foil bent into a desired position for connecting said lead foil to said contact field.

8. An adapter according to claim 7, wherein said lead foil is bent to a Z-shape.

9. An adapter according to claim 1, wherein said electronic components are positioned on said first and second faces of said circuit board and wherein said circuit board is positioned in said housing so as to be spaced from a bottom of said housing in order to accommodate said electronic components on said second face facing said bottom.

10. An adapter according to claim 1, wherein said reinforcement member projects with at least one side past a transition area of said printed circuit board into an area where said contact field is located.

11. An adapter according to claim 1, wherein said frame is an integral part of said housing and is comprised of folded portions of said housing and wherein at least one of said folded portions is folded twice and has a free folded surface connected to said reinforcement member.

12. An adapter according to claim 11, wherein said folded portions comprise stamped or cut-out spring elements.

* * * * *